(12) United States Patent
Wei et al.

(10) Patent No.: US 10,115,573 B2
(45) Date of Patent: Oct. 30, 2018

(54) APPARATUS FOR HIGH COMPRESSIVE STRESS FILM DEPOSITION TO IMPROVE KIT LIFE

(71) Applicant: APPLIED MATERIALS, INC., Santa Clara, CA (US)

(72) Inventors: Junqi Wei, Xi'an Hi-Tech Zone (CN); Kirankumar Savandaiah, Bangalore (IN); Ananthkrishna Jupudi, Milpitas, CA (US); Zhitao Cao, Campbell, CA (US); Yueh Sheng Ow, Yishun (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 189 days.

(21) Appl. No.: 14/864,031

(22) Filed: Sep. 24, 2015

(65) Prior Publication Data

US 2016/0104603 A1 Apr. 14, 2016

Related U.S. Application Data

(60) Provisional application No. 62/063,926, filed on Oct. 14, 2014.

(51) Int. Cl.
*H01J 37/34* (2006.01)
*H01J 37/32* (2006.01)

(52) U.S. Cl.
CPC .... *H01J 37/3288* (2013.01); *H01J 37/32477* (2013.01); *H01J 37/32623* (2013.01); *H01J 37/32642* (2013.01)

(58) Field of Classification Search
CPC .......................... H01J 37/3411; H01J 37/3441

USPC ................................ 204/298.01; 118/723 R
See application file for complete search history.

(56) References Cited

U.S. PATENT DOCUMENTS

| 7,981,262 | B2 | 7/2011 | Pavloff et al. |
| 2001/0042514 | A1 | 11/2001 | Mizuno et al. |
| 2004/0144492 | A1 | 7/2004 | Ikeda et al. |
| 2007/0102286 | A1* | 5/2007 | Scheible ............. C23C 14/3407 204/298.01 |
| 2007/0283884 | A1 | 12/2007 | Tiller et al. |

(Continued)

OTHER PUBLICATIONS

International Search Report and Written Opinion dated Dec. 21, 2015 for PCT Application No. PCT/US2015/052803.

(Continued)

*Primary Examiner* — Timon Wanga
(74) *Attorney, Agent, or Firm* — Moser Taboada; Alan Taboada

(57) ABSTRACT

Apparatus for extending process kit components lifetimes are disclosed. In some embodiments, a process kit includes: a first ring having an inner wall defining an inner diameter, an outer wall defining an outer diameter, an upper surface between the inner wall and the outer wall, and an opposing lower surface between the inner wall and the outer wall, wherein a first portion of the upper surface proximate the inner wall is concave, and wherein a second portion of the upper surface extends horizontally away from the first portion; and a second ring having an upper surface and an opposing lower surface, wherein a first portion of the lower surface is configured to rest upon the second portion of the first ring, wherein a second portion of the lower surface is convex and extends into but does not touch the concave first portion of the upper surface of the first ring.

20 Claims, 4 Drawing Sheets

(56) References Cited

U.S. PATENT DOCUMENTS

2008/0141942 A1\* 6/2008 Brown .................. C23C 14/564
                                                    118/723 R
2008/0276958 A1   11/2008 Mehta et al.
2009/0200251 A1    8/2009 Shimizu et al.
2014/0224426 A1    8/2014 Kim et al.

OTHER PUBLICATIONS

Search Report received from The State Intellectual Property Office of the People's Republic of China dated May 22, 2018 for China Patent Application No. 2015800531465.

\* cited by examiner

APPARATUS FOR HIGH COMPRESSIVE STRESS FILM DEPOSITION TO IMPROVE KIT LIFE

CROSS-REFERENCE TO RELATED APPLICATIONS

This application claims benefit of U.S. provisional patent application Ser. No. 62/063,926, filed Oct. 14, 2014, which is herein incorporated by reference in its entirety.

FIELD

Embodiments of the present disclosure generally relate to substrate processing systems.

BACKGROUND

High stress compressive films, for example titanium-tungsten (TiW) alloy films, are generally deposited in process chambers adapted for performing various deposition, etch, and thermal processes, among other processes, upon substrates, such as silicon (Si) wafers. These processes often result in the deposition of such films on surfaces of various exposed components of the processing chambers, such as process kits (e.g., heat rings, deposition rings, retaining rings, and the like), process shields (heat shields, plasma shields, and the like), and the like, where some or all of the film material can peel off the component surface. As such, these components are periodically inspected, refurbished (e.g., cleaned), and/or replaced—typically, on a set maintenance schedule (e.g., after a predetermined number of manufacturing cycles), resulting in processing delays.

Accordingly, the inventors have provided improved methods and apparatus for extending the processing lifetime of process kit components.

SUMMARY

Embodiments of the present disclosure include methods and apparatus for extending the processing lifetime of process kit components. In some embodiments, a process kit includes: a first ring having an inner wall defining an inner diameter, an outer wall defining an outer diameter, an upper surface disposed between the inner wall and the outer wall, and an opposing lower surface disposed between the inner wall and the outer wall, wherein a first portion of the upper surface proximate the inner wall is concave, and wherein a second portion of the upper surface extends horizontally away from the first portion; and a second ring having an upper surface and an opposing lower surface, wherein a first portion of the lower surface is configured to rest upon the second portion of the first ring, wherein a second portion of the lower surface is convex and extends into but does not touch the concave first portion of the upper surface of the first ring.

In some embodiments, a physical vapor deposition chamber includes: a chamber body having a first volume; a chamber lid comprising a target assembly disposed atop the chamber body; a substrate support disposed within the first volume, opposite the target assembly, and having a substrate processing surface; a shield disposed within the chamber body comprising one or more sidewalls configured to surround the first volume, wherein the shield extends downwardly to below a top surface of the substrate support and returns upwardly until reaching a top surface of the substrate support to form a u-shaped portion at a bottom of the shield; and a process kit. In some embodiments, the process kit may include: a first ring having an inner wall defining an inner diameter, an outer wall defining an outer diameter, an upper surface disposed between the inner wall and the outer wall, and an opposing lower surface disposed between the inner wall and the outer wall, wherein a first portion of the upper surface proximate the inner wall is concave, and wherein a second portion of the upper surface extends horizontally away from the first portion; and a second ring having an upper surface and an opposing lower surface, wherein a first portion of the lower surface is configured to rest upon the second portion of the first ring, wherein a second portion of the lower surface is convex and extends into but does not touch the concave first portion of the upper surface of the first ring, wherein the lower surface of the second ring further comprising a third portion having a first protruding surface and a second protruding surface extending downward away from the lower surface of the second ring, wherein the first protruding surface and the second protruding surface are spaced apart to define an opening, wherein a terminal portion of the shield is disposed in the opening to support the second ring, and wherein the second protruding surface comprises a tapered portion proximate the outer wall of the first ring, wherein the tapered portion is configured to align the second ring and the first ring.

In some embodiments, a process kit may include a first titanium ring and a second titanium ring. The first titanium ring having an inner wall defining an inner diameter, an outer wall defining an outer diameter, an upper surface disposed between the inner wall and the outer wall, a flat inner edge surface proximate the inner wall, and an opposing lower surface disposed between the inner wall and the outer wall. A first portion of the upper surface proximate the inner wall is concave, and a second portion of the upper surface extends horizontally away from the first portion. A notch is disposed between the flat inner edge surface and the concave first portion of the upper surface, and a channel is disposed in the second portion between the outer wall and the concave first portion of the upper surface. The second titanium ring having an upper surface and an opposing lower surface, wherein a first portion of the lower surface is configured to rest upon the second portion of the first titanium ring, wherein a second portion of the lower surface is convex and extends into but does not touch the concave first portion of the upper surface of the first titanium ring, wherein the lower surface of the second titanium ring further comprising a third portion having a first protruding surface and a second protruding surface extending downward away from the lower surface of the second titanium ring, wherein the first protruding surface and the second protruding surface are spaced apart to define an opening, wherein the second protruding surface comprises a tapered portion proximate the outer wall of the first titanium ring, wherein the tapered portion is configured to align the second titanium ring and the first titanium ring, and wherein the second portion of the lower surface and the concave first portion of the upper surface of the first titanium ring form a gap of at least about 2.86 inches.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure include methods and apparatus for extending the processing lifetime of process kit components. In some embodiments, a process kit, comprising for example of a cover ring and a deposition ring, for use in substrate processing chambers is disclosed. When depositing a high compressive stress film (such as a titanium-tungsten (TiW) alloy film) via a physical vapor deposition process, embodiments of the inventive process kits described herein advantageously improve process kit life for TiW film deposition processes, as well as for other high stress compressive film deposition and to improve tool up time and reduce processing costs.

Figure 1:
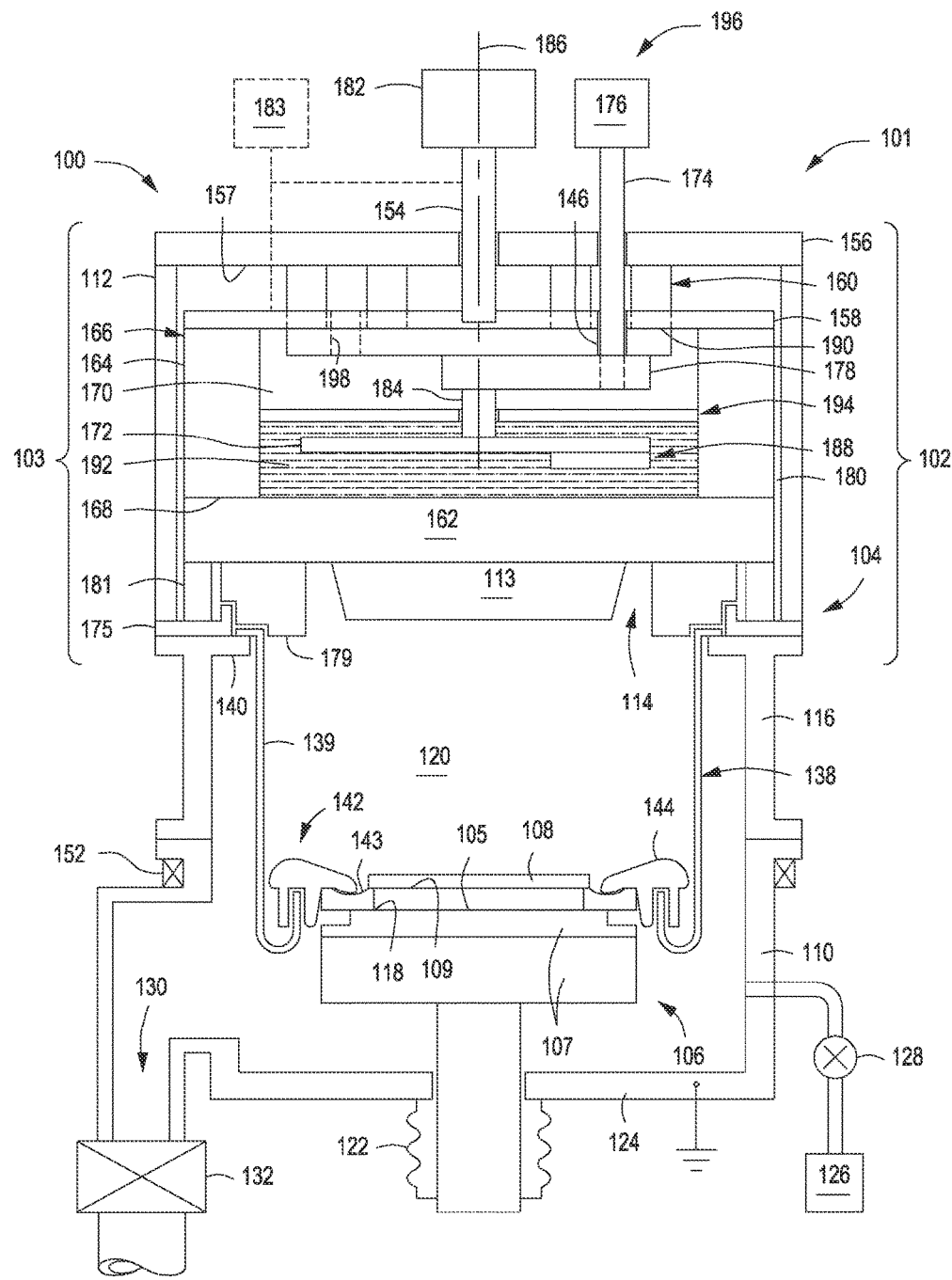
FIG. 1 depicts a schematic cross sectional view of a process chamber having a substrate support in accordance with some embodiments of the present disclosure.

FIG. 1 depicts a simplified, cross-sectional view of a physical vapor deposition (PVD) chamber 100. The PVD chamber 100 comprises a substrate support 106 in accordance with some embodiments of the present disclosure. Examples of PVD chambers suitable for modification in accordance with the teachings provided herein include chambers having very high frequency (VHF) sources, the ALPS® Plus and SIP ENCORE® PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein and be used to perform embodiments of the inventive methods disclosed herein.

In some embodiments of the present disclosure, the PVD chamber 100 includes a chamber lid 101 disposed atop a chamber body 104 and removable from the chamber body 104. The chamber lid 101 may include a target assembly 102 and a grounding assembly 103. The chamber body 104 contains a substrate support 106 for receiving a substrate 108 thereon. The substrate support 106 may be located within a lower grounded enclosure wall 110, which may be a chamber wall of the chamber body 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g. a shield 138 as discussed below) and ultimately back to the grounding assembly 103 of the chamber lid 101. The RF power source 182 may provide RF power to the target assembly 102 as discussed below.

The substrate support 106 has a material-receiving surface facing a principal surface of a target 114 (or source material) and supports the substrate 108 to be sputter coated with material from the target in planar position opposite to the principal surface of the target 114. In some embodiments, the substrate 108 may be held on the substrate support 106 by a vacuum. In some embodiments, the substrate support 106 may include a dielectric member 105 having a substrate processing surface 109 for supporting the substrate 108 thereon. In some embodiments, the substrate support 106 may include one or more first conductive members 107 disposed below the dielectric member 105 and having a dielectric member facing surface 118 adjacent to the dielectric member 105. For example, the dielectric member 105 and the one or more first conductive members 107 may be part of an electrostatic chuck, RF electrode, or the like which may be used to provide chucking or RF power to the substrate support 106.

The substrate support 106 may support the substrate 108 in a first volume 120 of the chamber body 104. The first volume 120 may be a portion of the inner volume of the chamber body 104 that is used for processing the substrate 108 and may be separated from the remainder of the inner volume (e.g., a non-processing volume) during processing of the substrate 108. The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through a load lock valve, or opening, (not shown) in the lower portion of the chamber body 104 and thereafter raised or lowered for a particular application. A bellows 122 connected to a bottom chamber wall 124 may be provided to maintain a separation of the inner volume of the chamber body 104 from the atmosphere outside of the chamber body 104. One or more gases may be supplied from a gas source 126 through a mass flow controller 128 into the lower part of the chamber body 104. An exhaust port 130 may be provided and coupled to a pump (not shown) via a valve 132 for exhausting the interior of the chamber body 104 and to facilitate maintaining a predetermined pressure inside the chamber body 104.

The chamber body 104 further comprises a process kit 142. The process kit may include a first ring 143 (i.e. a deposition ring) and a second ring 144 (i.e. a cover ring). In some embodiments, the first ring 143 is an annular ring around the substrate support 106 to shield the sidewall and peripheral edge of the substrate support 106 from process deposits. In some embodiments, the second ring 144 is an annular ring disposed above the first ring 143 and is generally used to prevent deposition below the substrate and to assist in controlling deposition at or below the substrate's edge. In some embodiments, the first ring 143 and second ring 144 may have other suitable configurations, such as oval or square.

The inventors have observed that a significant concern for the deposition of high compressive stress film, such as a titanium-tungsten (TiW) alloy film, is the coefficient of thermal expansion (CTE) mismatch between the deposited film and the process kit surface on which the film is deposited. Typically the material of the process kit components is ceramic or stainless steel (SST). However, the inventors have observed that the CTE of titanium is much closer to that of TiW. Thus, in some embodiments, the first ring 143 and the second ring 144 are composed of titanium.

Figure 2:
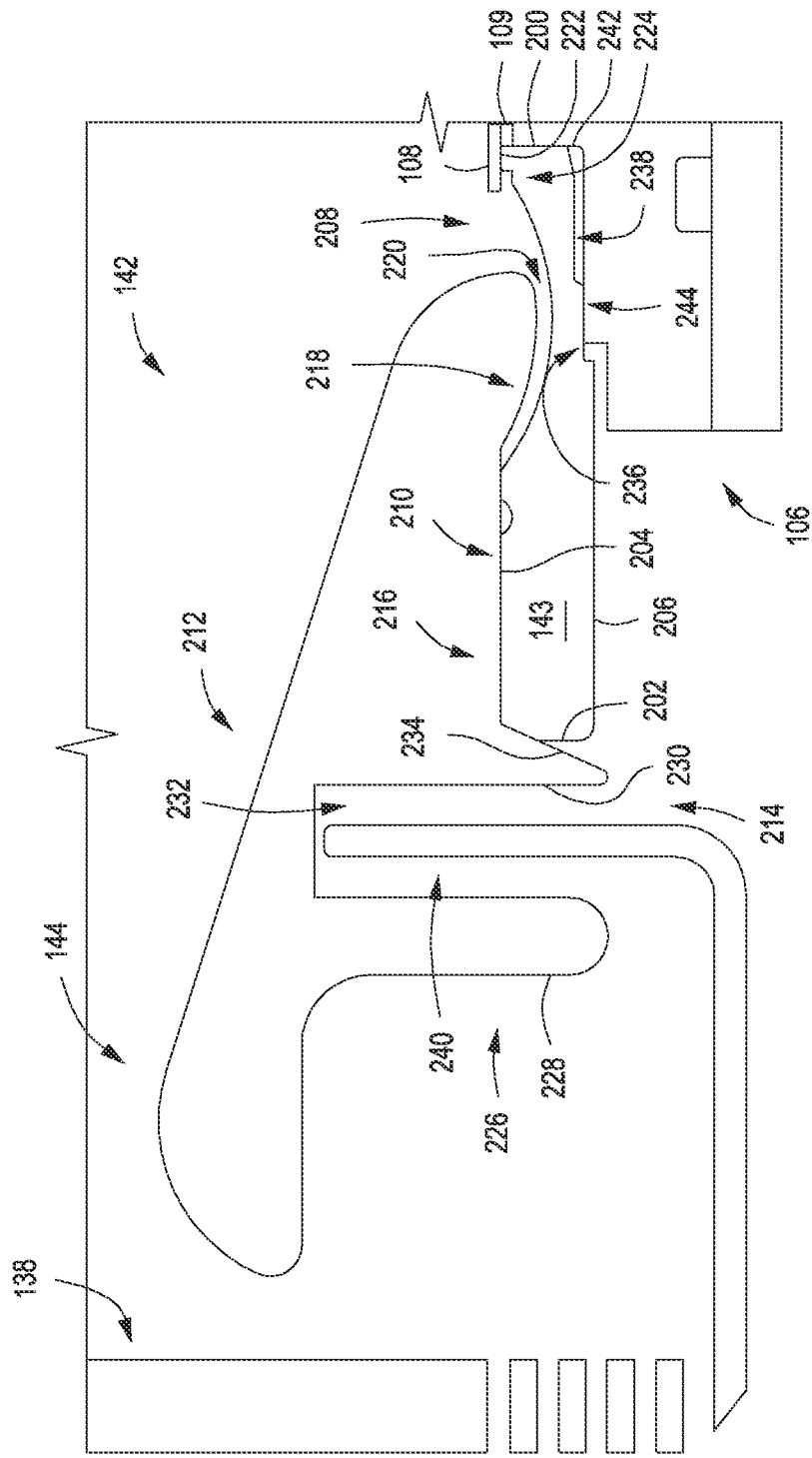
FIG. 2 depicts a process kit and surrounding components in accordance with some embodiments of the present disclosure.
Figure 3:
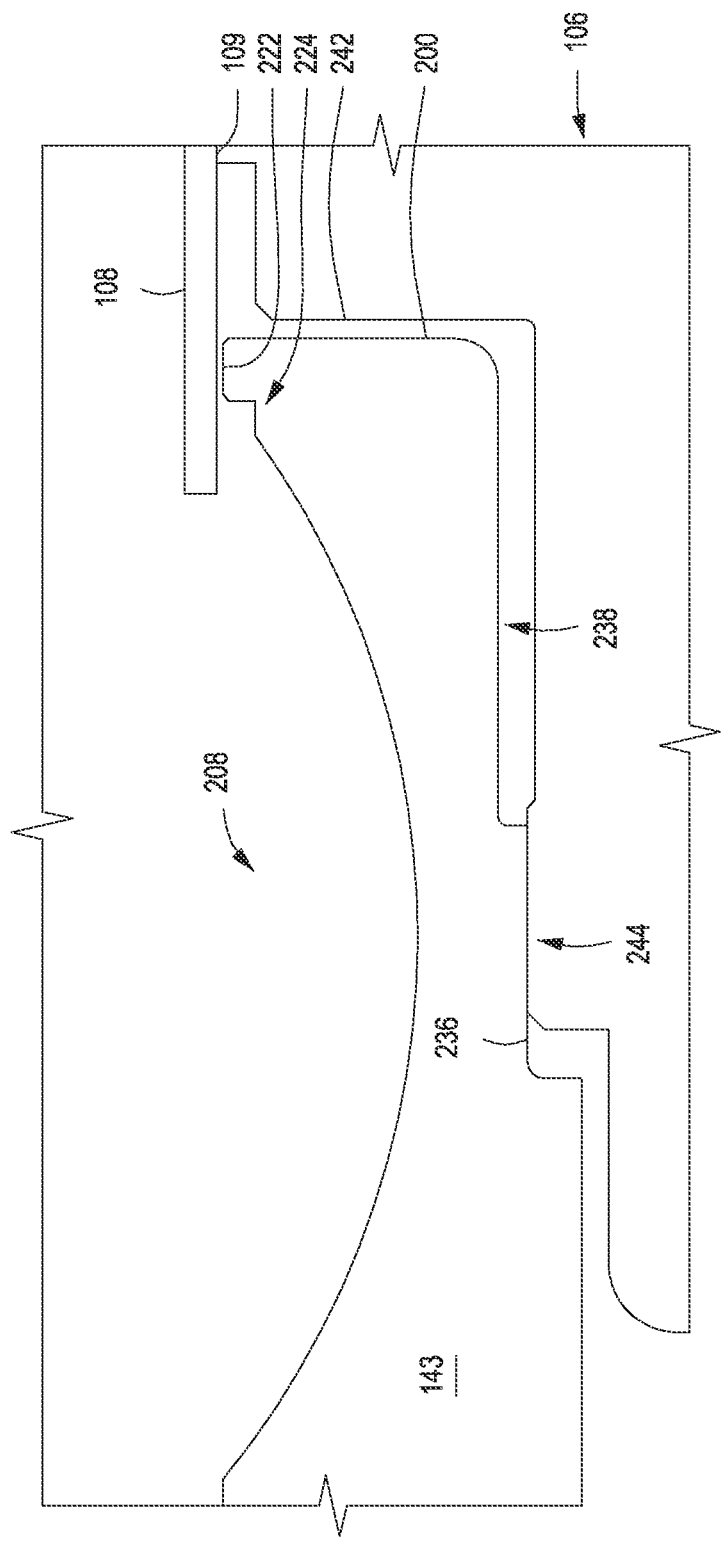
FIG. 3 depicts a process kit and surrounding components in accordance with some embodiments of the present disclosure.
Figure 4:
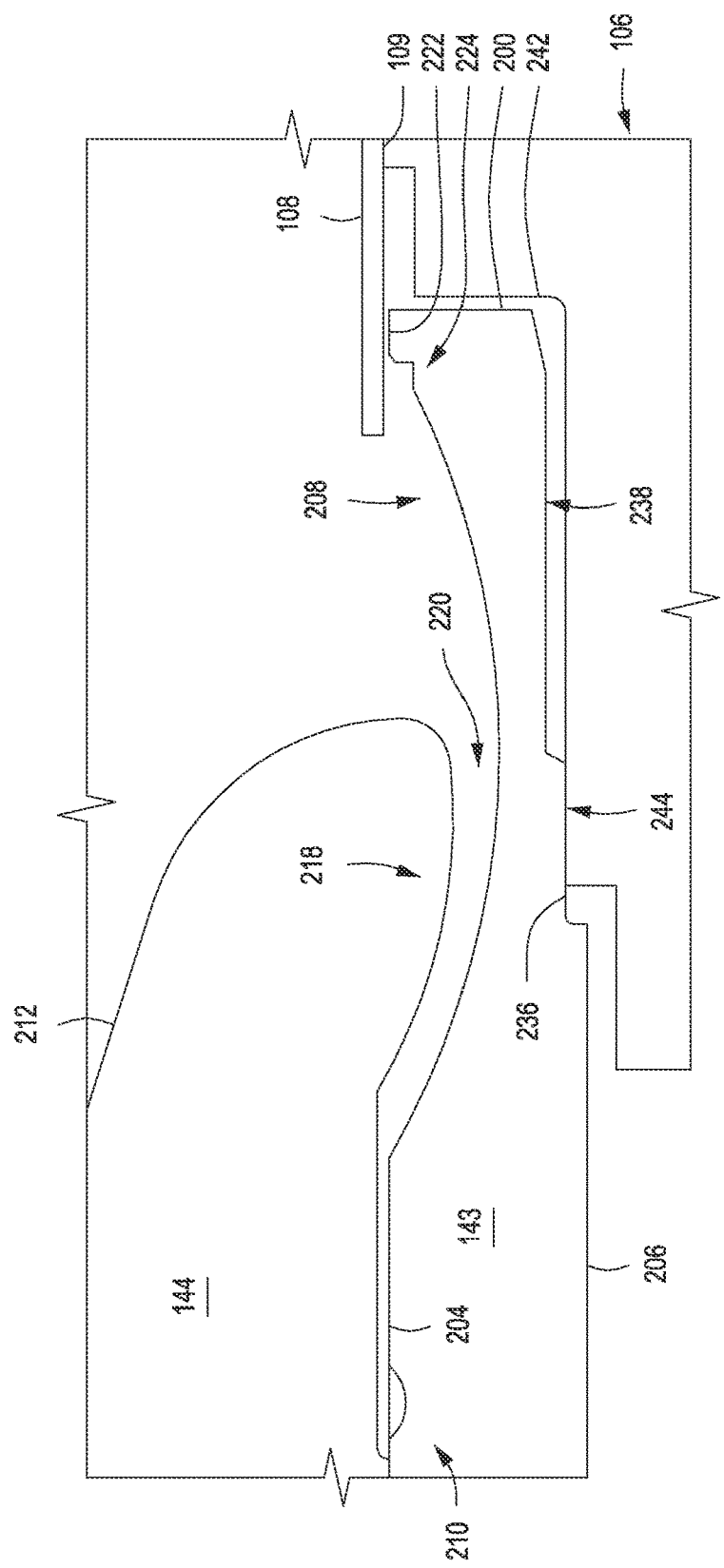
FIG. 4 depicts a process kit and surrounding components in accordance with some embodiments of the present disclosure To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

FIGS. 2, 3, and 4 depict the process kit 142 and surrounding components in accordance with some embodiments of the present disclosure. In some embodiments, the substrate support 106 has dielectric member 105 having a substrate processing surface 109 to support the substrate 108. The dielectric member 105 having a perimeter sidewall 242 which lies below an overhanging edge of the substrate 108. The substrate support 106 comprises an annular ledge 244 that surrounds the circumference of the perimeter sidewall 242. FIG. 2 further depicts the first ring 143 and the second ring 144.

The first ring 143 comprises an inner wall 200 defining an inner diameter of the first ring 143. In some embodiments, the inner wall 200 of the first ring 143 abuts the perimeter sidewall 242 of the substrate support 106. The first ring 143 further comprises a flat inner edge surface 222 proximate the inner wall 200. The inner diameter of the first ring 143 is less than the diameter of the substrate 108 to be processed in the PVD chamber 100 comprising the process kit 142. As a result, the substrate 108 retained atop the substrate processing surface 109 overhangs the flat inner edge surface 222 and an inner portion of the first ring 143.

The first ring 143 further comprises an outer wall 202 defining an outer diameter. An upper surface 204 and an opposing lower surface 206 are disposed between the inner wall 200 and the outer wall 202. The upper surface 204 comprises a first portion 208 proximate the inner wall 200 that is concave (i.e. a concave first portion 208 of the upper surface 204). In some embodiments, the concave first portion 208 of the upper surface 204 functions as a material collection surface upon which sputtered material from the target accumulates to form deposits. The inventors have observed that material sputtered from the target onto a smooth concave profile having a radius of, for example about 2.86 inches, or more, adheres to that surface without substantially any peeling. Thus, the geometry of the process kit described herein advantageously only provides line of sight to areas having a large radius, for example greater than about 2.86 inches, for sputtered target material to deposit upon.

The upper surface 204 further comprises a second portion 210 extending horizontally away from the concave first portion 208 and terminating at the outer wall 202. The first ring further comprises a notch 224 between the flat inner edge surface 222 and the concave first portion 208 of the upper surface 204 of the first ring 143. In some embodiments, the notch 224 is configured to prevent sputter material from the target from depositing on the flat inner edge surface 222. In some embodiments, the intersection of the concave first portion 208 of the upper surface 204 and the notch has a radius of, for example about 0.01 inches. The lower surface 206 of the first ring 143 further comprises a first recessed portion (236) and a second recessed portion (238) formed between the inner wall and the outer wall. The first ring 143 is supported on annular ledge 244 that surrounds the circumference of the perimeter sidewall 242 of the substrate support 106.

The second ring 144 comprises an upper surface 212 and an opposing lower surface 214. The upper surface 212 of the second ring 144 is an inclined surface sloped radially inwards. The lower surface 214 of the second ring 144 comprises a first portion 216 configured to rest upon the second portion 210 of the first ring 143. The lower surface 214 of the second ring 144 further comprises a second portion 218. The second portion 218 is convex (i.e. convex second portion 218) and extends into, but does not touch the concave first portion 208 of the upper surface 204 of the first ring 143. The second portion 218 of the lower surface 214 of the second ring 144 covers portions of the concave first portion 208 of the upper surface 204 of the first ring 143 having a radius of less than about 2.86 inches. As described above, such small radius areas provide a surface that allows the peeling of material deposited on the surface. Covering the small radius portion of the first ring 143 advantageously prevents or reduces deposition of material onto these areas, resulting in reduced peeling from such areas. The convex second portion 218 of the lower surface 214 of the second ring 144 and the concave first portion 208 of the upper surface 204 of the first ring 143 form a gap 220. In some embodiments, the gap 220 is about 0.053 inches or less at the opening. In some embodiments, the gap decreases in the direction of the outer wall 202, for example to about 0.045 inches or less. In some embodiments, the size of the gap 220 reduces or substantially eliminates sputtered material from the target from depositing on the portion of the concave first portion 208 of the upper surface 204 that is shadowed by the second portion of the lower surface of the second ring.

The lower surface 214 of the second ring 144 further comprises a third portion 226. The third portion 226 comprises a first protruding surface 228 and a second protruding surface 230. The first protruding surface 228 and the second protruding surface 230 extend downward away from the lower surface 214 of the second ring 144. The first protruding surface 228 and the second protruding surface 230 are spaced apart to define an opening 232. The second protruding surface 230 comprises a tapered portion 234 proximate the outer wall 202 of the first ring 143. The tapered portion 234 aligns the second ring 144 atop the first ring 143.

The chamber body 104 further includes a process kit shield, or shield 138, to surround the processing, or first volume of the chamber body 104 and to protect other chamber components from damage and/or contamination from processing. In some embodiments, the shield 138 may be a grounded shield connected to a ledge 140 of an upper grounded enclosure wall 116 of the chamber body 104. As illustrated in FIG. 1, the chamber lid 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 101. However, other RF return paths are possible, such as via the grounded shield 138.

The shield 138 extends downwardly and may include one or more sidewalls 139 configured to surround the first volume 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). The second ring 144 rests on the top of the u-shaped portion of the shield 138. A terminal portion 240 of the shield 138 is disposed in the opening 232 to support the second ring 144. In some embodiments, as depicted in FIG. 1, the sidewalls 139 of the shield 138 are substantially vertically to provide a flat area having a large radius to prevent peeling of sputtered target material that may adhere to the sidewalls 139 of the shield.

Returning to FIG. 1, and in some embodiments, a magnet 152 may be disposed about the chamber body 104 for selectively providing a magnetic field between the substrate support 106 and the target 114. For example, as shown in FIG. 1, the magnet 152 may be disposed about the outside of the lower grounded enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extending from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield 179. The seal ring 181 may be a ring or other annular shape having a predetermined cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The dark space shield 179 is generally disposed about an outer edge of the target 114, such about an outer edge of a source material 113 of the target 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dielectric dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the PVD chamber 100, advantageously promoting more uniform processing of substrates. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target 114. In some embodiments, the support member 175 may be circular, or disc-like in shape, although the shape may vary depending upon the corresponding shape of the chamber lid and/or the shape of the substrate to be processed in the PVD chamber 100. In use, when the chamber lid 101 is opened or closed, the support member 175 maintains the dark space shield 179 in proper alignment with respect to the target 114, advantageously minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include a backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a predetermined portion of the cavity 170 (such as a lower portion, as shown) and to prevent the cooling fluid 192 from reaching components disposed on the other side of the divider 194, as discussed below.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between 5 mm and 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF power source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through the grounding plate 156 and is coupled to a source distribution plate 158. The grounding plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154

One or more portions of a magnetron assembly 196 may be disposed at least partially within the cavity 170. The magnetron assembly provides a rotating magnetic field proximate the target to assist in plasma processing within the chamber body 104. In some embodiments, the magnetron assembly 196 may include a motor 176, a motor shaft 174, a gear box 178, a gear box shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gear box shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present disclosure, the electrode 154 is aligned with the central axis 186 of the PVD chamber. As such, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled to the magnet support member 172 in a predetermined position. For example, in some embodiments, the magnet support member 172 may comprise a plate, a disk, a cross member, or the like. The plurality of magnets 188 may be configured in any manner to provide a magnetic field having a predetermined shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 is sized sufficiently to fit within the cavity 170, or within the upper portion of the cavity 170 when the divider 194 is present. The motor 176 may be an electric motor, a pneumatic or hydraulic drive, or any other process-compatible mechanism that can provide sufficient torque.

While the foregoing is directed to embodiments of the present disclosure, other and further embodiments of the disclosure may be devised without departing from the basic scope thereof.

The invention claimed is:

1. A process kit, comprising:
    a first ring having an inner wall defining an inner diameter, an outer wall defining an outer diameter, an upper surface disposed between the inner wall and the outer wall, and an opposing lower surface disposed between the inner wall and the outer wall, wherein a first portion of the upper surface proximate the inner wall is concave, and wherein a second portion of the upper surface has a length that extends horizontally away from the first portion and terminates at the outer wall; and
    a second ring having an upper surface and an opposing lower surface, wherein a first portion of the lower surface of the second ring is configured to rest upon the length of the upper surface of the second portion of the first ring, wherein a second portion of the lower surface of the second ring is convex and extends into but does not touch the concave first portion of the upper surface of the first ring.

2. The process kit of claim 1, wherein the second portion of the lower surface and the concave first portion of the upper surface of the first ring form a gap that decreases in a direction toward the outer wall.

3. The process kit of claim 1, wherein the first ring is titanium.

4. The process kit of claim 1, wherein the second ring is titanium.

5. The process kit of claim 1, wherein the concave first portion of the upper surface of the first ring is defined by a radius.

6. The process kit of claim 5, wherein the radius is about 2.86 inches or more.

7. The process kit of claim 1, wherein the inner diameter of the first ring is less than a diameter of a substrate to be processed in a processing chamber comprising the process kit.

8. The process kit of claim 1, the first ring further comprising a flat inner edge surface proximate the inner wall.

9. The process kit of claim 8, further comprising a notch between the flat inner edge surface and the concave first portion of the upper surface of the first ring.

10. The process kit of claim 1, wherein the lower surface of the second ring is linear from the second portion to a tapered portion proximate the outer wall of the first ring.

11. The process kit of claim 10, wherein a second protruding surface comprises a tapered portion proximate the outer wall of the first ring, and wherein the tapered portion is configured to align the second ring and the first ring.

12. The process kit of claim 1, wherein the lower surface of the first ring comprises a first recessed portion and a second recessed portion formed between the inner wall and the outer wall.

13. The process kit of claim 1, wherein the upper surface of the second ring is an inclined surface sloped radially inwards.

14. The process kit of claim 1, wherein the second portion of the lower surface of the second ring covers portions of the concave first portion of the upper surface of the first ring having a radius of less than about 2.86 inches.

15. A physical vapor deposition chamber, comprising:
    a chamber body having a first volume;
    a chamber lid comprising a target assembly disposed atop the chamber body;
    a substrate support disposed within the first volume, opposite the target assembly, and having a substrate processing surface;
    a shield disposed within the chamber body comprising one or more sidewalls configured to surround the first volume, wherein the shield extends downwardly to below a top surface of the substrate support and returns upwardly until reaching a top surface of the substrate support to form a u-shaped portion at a bottom of the shield; and
    a process kit, comprising:
    a first ring having an inner wall defining an inner diameter, an outer wall defining an outer diameter, an upper surface disposed between the inner wall and the outer wall, and an opposing lower surface disposed between the inner wall and the outer wall, wherein a first portion of the upper surface proximate the inner wall is concave, and wherein a second portion of the upper surface has a length that extends horizontally away from the first portion and terminates at the outer wall; and
    a second ring having an upper surface and an opposing lower surface, wherein a first portion of the lower surface of the second ring is configured to rest upon the length of the upper surface of the second portion of the first ring, wherein a second portion of the lower surface of the second ring is convex and extends into but does not touch the concave first portion of the upper surface of the first ring, wherein the lower surface of the second ring further comprises a third portion having a first protruding surface and a second protruding surface extending downward away from the lower surface of the second ring, wherein the first protruding surface and the second protruding surface are spaced apart to define an opening, wherein a terminal portion of the shield is disposed in the opening to support the second ring, and wherein the second protruding surface comprises a tapered portion proximate the outer wall of the first ring, wherein the tapered portion is configured to align the second ring and the first ring.

16. The physical vapor deposition chamber of claim 15, wherein the second portion of the lower surface and the concave first portion of the upper surface of the first ring form a gap of about 0.053 inches or less which decreases in a direction toward the outer wall.

17. The physical vapor deposition chamber of claim 15, wherein the first ring and the second ring are composed of titanium.

18. The physical vapor deposition chamber of claim 15, wherein the concave first portion of the upper surface of the first ring is defined by a radius of about 2.86 inches or more.

19. The physical vapor deposition chamber of claim 15, wherein the lower surface of the first ring comprises a first recessed portion and second recessed portion formed between the inner wall and the outer wall, wherein the first recessed portion of the lower surface of the first ring supports the first ring atop the substrate support.

20. A process kit, comprising:
a first titanium ring having:
   an inner wall defining an inner diameter,
   an outer wall defining an outer diameter,
   an upper surface disposed between the inner wall and the outer wall,
   a flat inner edge surface proximate the inner wall,
   an opposing lower surface disposed between the inner wall and the outer wall, wherein a first portion of the upper surface proximate the inner wall is concave, and wherein a second portion of the upper surface extends horizontally away from the first portion,
   a notch between the flat inner edge surface and the concave first portion of the upper surface, and
   a channel in the second portion between the outer wall and the concave first portion of the upper surface; and
a second titanium ring having an upper surface and an opposing lower surface,
   wherein a first portion of the lower surface of the second titanium ring is configured to rest upon the length of the second portion of the first titanium ring,
   wherein a second portion of the lower surface of the second titanium ring is convex and extends into but does not touch the concave first portion of the upper surface of the first titanium ring,
   wherein the lower surface of the second titanium ring further comprises a third portion having a first protruding surface and a second protruding surface extending downward away from the lower surface of the second titanium ring,
   wherein the first protruding surface and the second protruding surface are spaced apart to define an opening,
   wherein the second protruding surface comprises a tapered portion proximate the outer wall of the first titanium ring, wherein the tapered portion is configured to align the second titanium ring and the first titanium ring, and
   wherein the second portion of the lower surface of the second titanium ring and the concave first portion of the upper surface of the first titanium ring form a gap of about 0.053 inches or less.

* * * * *